United States Patent [19]
Takahashi

[11] Patent Number: 5,153,856
[45] Date of Patent: Oct. 6, 1992

[54] DRAM CONTROLLER

[75] Inventor: Toshiyasu Takahashi, Mishima, Japan

[73] Assignee: Tokyo Electric Co., Ltd., Tokyo, Japan

[21] Appl. No.: 660,225

[22] Filed: Feb. 21, 1991

Related U.S. Application Data

[63] Continuation of Ser. No. 475,207, Feb. 5, 1990, abandoned.

[30] Foreign Application Priority Data

Feb. 10, 1989 [JP] Japan ................................. 1-32263

[51] Int. Cl.⁵ ............................................. G11C 13/00
[52] U.S. Cl. ................................. 365/233; 365/222; 365/189.04
[58] Field of Search .................. 365/222, 233, 189.01, 365/189.04, 230.01

[56] References Cited

U.S. PATENT DOCUMENTS 4,660,180  4/1987  Tanimura et al. ................... 365/222

FOREIGN PATENT DOCUMENTS 0109298  5/1984  European Pat. Off. .

OTHER PUBLICATIONS

IBM Technical Disclosure Bulletin, vol. 31, No. 8, Jan. 1989, pp. 310-312, Programmable Pulse Sequence Control of Dynamic RAMS.
Hitachi Review, vol. 35, No. 5, Oct. 1986, pp. 255-258, 1 Mbit Dynamic RAM "HM511000 Series".
Patent Abstracts of Japan, vol. 012, No. 408, Oct. 1988, Control System for Dynamic RAM.

Primary Examiner—Terrell W. Fears
Attorney, Agent, or Firm—Frishauf, Holtz, Goodman & Woodward

[57] ABSTRACT

A DRAM controller comprises an address output controller for transferring an address-designating signal to a dynamic RAM, a data output controller for transferring data to be written into and read-out from a memory region of the dynamic RAM which is designated by the address-designating signal, and a control circuit responsive to a mode-designating signal for generating various control signals corresponding to an access mode of the dynamic RAM designated by the mode-designating signal and for supplying control signals to the dynamic RAM, address output controller, and data output controller in a predetermined sequence. In the DRAM controller, the control circuit includes a signal-generating unit for generating control signals in a specific access mode which requires an access time longer than a machine cycle of a processor for generating the address-designating signal, the data to be written, and the mode-designating signal, the signal-generating means delaying generation control signals every time designation of the specific access mode by the mode-designating signal is repeated.

9 Claims, 5 Drawing Sheets

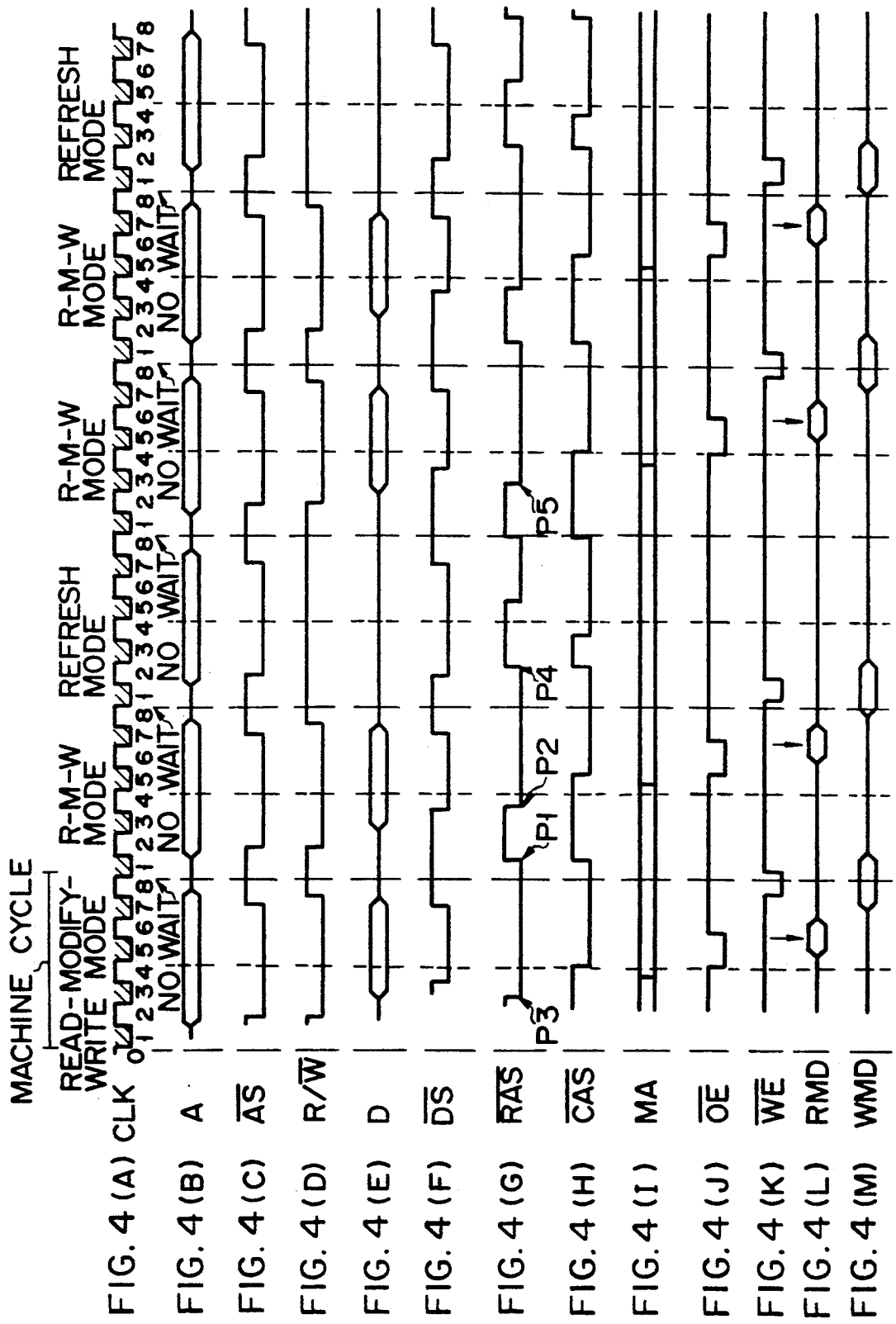

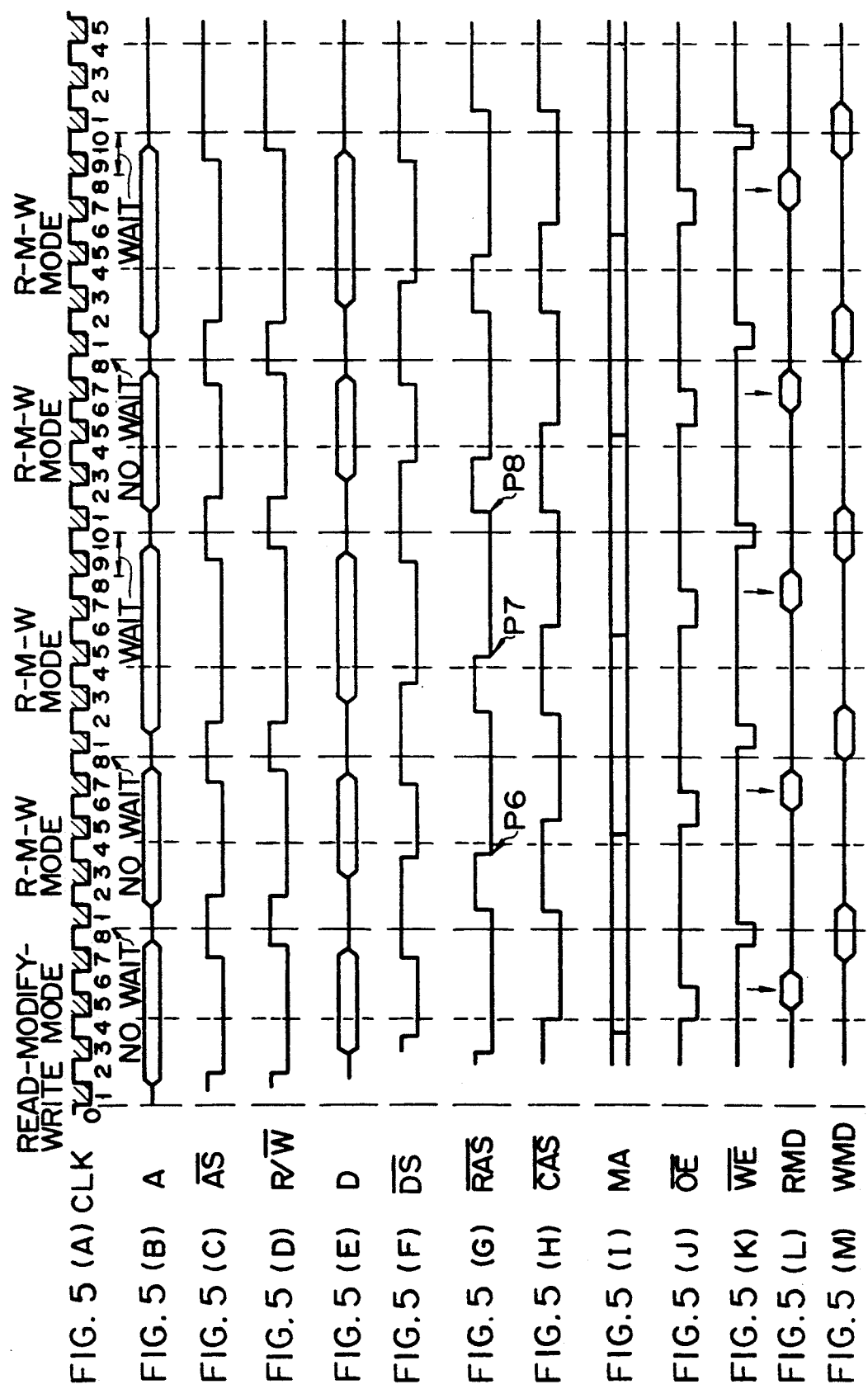

DRAM CONTROLLER

This application is a continuation of application Ser. No. 07/475,207 filed Feb. 5, 1990, now abandoned.

BACKGROUND OF THE INVENTION

1. Field of the Invention

The present invention relates to a DRAM controller for accessing a dynamic RAM (DRAM).

2. Description of the Related Art

Most computers have a dynamic RAM, a microprocessor, and a DRAM controller. A dynamic RAM has various access modes such as read mode, write mode, refresh mode, readmodify-mode, and the like. The DRAM controller is connected between the DRAM and the microprocessor. It generates various control signals in a predetermined sequence under the control of the microprocessor, and supplies these signals to the dynamic RAM, thereby controlling the dynamic RAM. More specifically, the DRAM controller receives an address signal A, an address strobe signal $\overline{AS}$, a read/write control signal $R/\overline{W}$, data D, and a data strobe signal $\overline{DS}$ from the microprocessor, and generates a row-address strobe signal $\overline{RAS}$, a column-address strobe signal $\overline{CAS}$, a memory address signal MA, an output enable signal $\overline{OE}$, and a write enable signal $\overline{WE}$, which are supplied, as control signals, to the dynamic RAM.

The operation of the conventional DRAM controller will be explained, with reference to FIGS. 1(A) to 1(M) which form a timing chart. A clock signal CLK shown in FIG. 1(A) is supplied to the microprocessor and the DRAM controller, both incorporated in a computer. The DRAM controller sets the dynamic RAM used in the computer to the read-modify-write mode while it is received the first to fifth clock pulses. As long as the dynamic RAM is set to the read-modify-write mode, data RMD is read from the dynamic RAM. This data RMD and the data D supplied from the microprocessor are subjected to an operation such as AND operation or OR operation, and the result of this operation is written into the dynamic RAM. To be more specific, the microprocessor first outputs an address signal A as is illustrated in FIG. 1(B), and then outputs a address strobe signal $\overline{AS}$ and a read/write control signal $R/W$, both at low level, as is shown in FIGS. 1(C) and 1(D). Thereafter, the microprocessor generates data D, as can be seen from FIG. 1(E), and then outputs a data strobe signal $\overline{DS}$ at the low level as is shown in FIG. 1(F).

After the address strobe signal $\overline{AS}$ has fallen to the low level, the DRAM controller supplies the dynamic RAM with a memory address signal MA which consists of the upper bits of the address signal A, as can be understood from FIG. 1(I). Further, it outputs a row-address strobe signal $\overline{RAS}$ at the low level. Thereafter, the DRAM controller supplies the dynamic RAM with a memory address signal MA which consists of the lower bits of the address signal A. Also, it outputs a column-address strobe signal $\overline{CAS}$ at the low level, at the trailing edge of the third clock pule, as is shown in FIG. 1H. At the same time the DRAM controller outputs an output enable signa $\overline{OE}$ at the low level, as is shown in FIG. 1(J). Hence, when data RMD is read from that region of the dynamic RAM which is designated by the memory address signal MA, the DRAM controller performs an operation on this data RMD and the data D. The results of this operation, or write data WMD, are supplied to the dynamic RAM. Then, the DRAM controller outputs a write enable signal $\overline{WE}$ at the low level. The write enable signal WE is supplied to the dynamic RAM, whereby the write data WMD is stored in that region of the dynamic RAM which has been designated by the memory address signal MA.

Assuming that the machine cycle of the microprocessor is a 4-clock pulse period, the read-modify-write operation is terminated at the leading edge of the fifth clock pulse. Therefore, the DRAM controller brings the microprocessor into the wait state at the leading edge of the fifth clock pulses, thereby causing the microprocessor to operated in synchronism with the dynamic RAM.

The time during which the dynamic RAM is accessed can be shortened by, for example, operating the microprocessor at a higher speed. However, this method cannot eliminate the wait period of the microprocessor, and does not serve to increase the data-processing speed of the computer very much.

SUMMARY OF THE INVENTION

The object of the present invention is to provide a DRAM controller capable of shortening the cycle time of a dynamic RAM which is repeatedly accessed in various modes.

The object is attained by a DRAM controller which comprises an address output circuit for transferring an address-designating signal to a dynamic RAM; a data output circuit for transferring data to be written into and read-out from a memory region of the dynamic RAM which is designated by the address-designating signal; and a control circuit responsive to a mode-designating signal for generating various control signals corresponding to an access mode of the dynamic RAM designated by the mode-designating signal and for supplying control signals to the dynamic RAM, the address output circuit and the data output circuit in a predetermined sequence. The control circuit includes a signal-generating section for generating the control signals in a specific access mode which requires an access time longer than a machine cycle of a processor for generating the address-designating signal, the data to be written, and the mode-designating signal, the signal-penetrating action generation of control signals every time designation of the specific access mode by the mode designating signal is repeated.

The signal-generating section delays the generation of the control signals for a predetermined period every time the designation of a specific access mode (e.g., the read-modify-write mode), which requires an access time longer than the machine cycle of the processor, is repeated. Due to this delay in generating the control signals, the processor need not be set in a waiting state, thus providing a time long enough to set up the dynamic RAM. In other words, the DRAM controller of the present invention can shorten the cycle time of the dynamic RAM more effectively than the conventional DRAM controller which sets the processor into a waiting state every time the read-modify-write mode is designated.

BRIEF DESCRIPTION OF THE DRAWINGS

FIGS. 4(A) to 4(M) form a timing chart explaining when the DRAM controller (FIG. 3) generates signals in the case where the dynamic RAM is set to the read-modify-write mode twice continuously; and FIGS. 5(A) to 5(M) form a timing chart explaining when the DRAM controller (FIG. 3) generates signals in the case where the dynamic RAM is set to the read-modify-write mode five times continuously.

DETAILED DESCRIPTION OF THE PREFERRED EMBODIMENT

A DRAM controller according to an embodiment of the invention will now be described, with reference to FIGS. 2 and 3.

Figure 1:
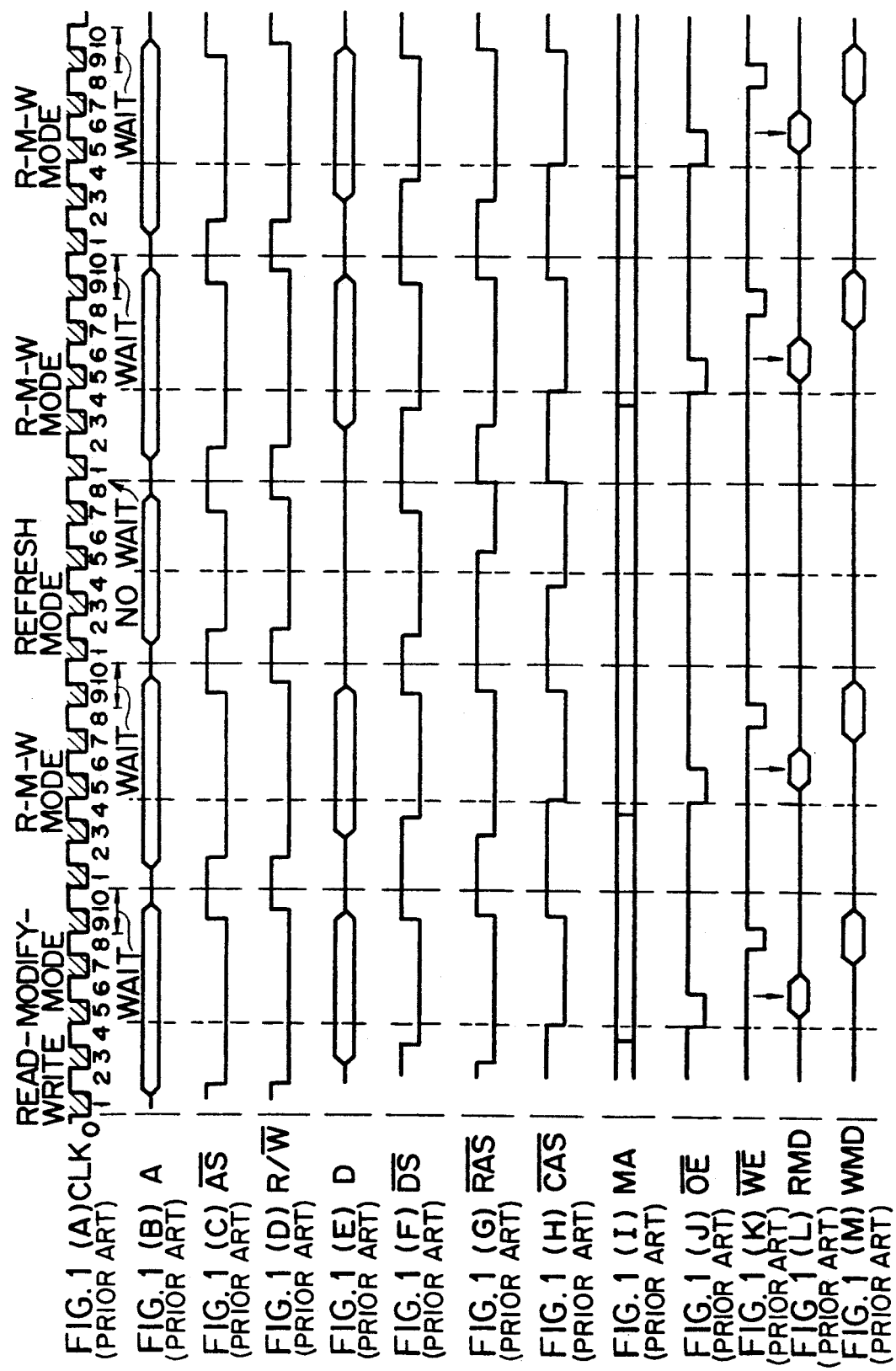
FIGS. 1(A) to 1(M) form a timing chart representing the operation of the conventional DRAM controller.
Figure 2:
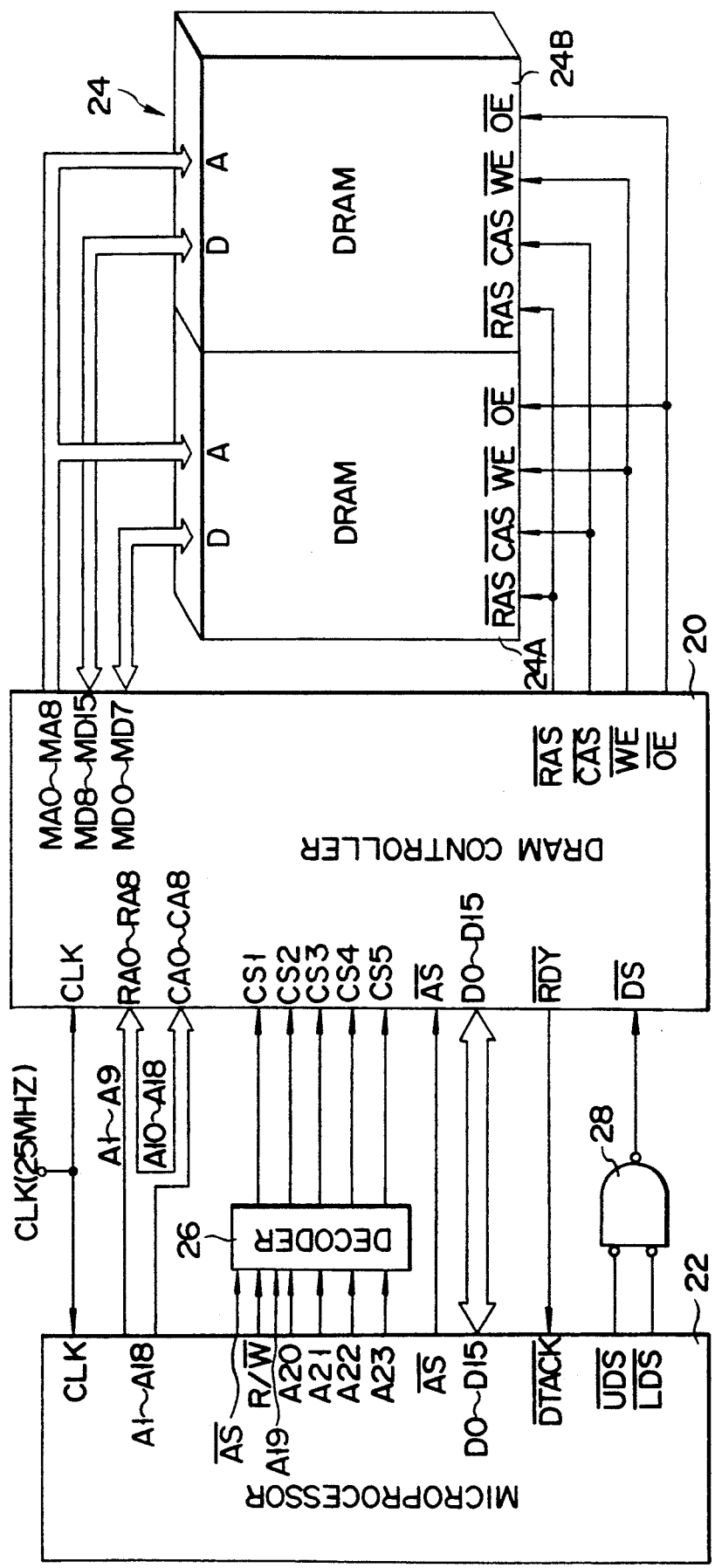
FIG. 2 is a block diagram a computer system comprising a microprocessor, a dynamic RAM, and a DRAM controller according to the present invention.

FIG. 2 is a block diagram showing a computer system comprising a DRAM controller 20, a microprocessor 22, and a dynamic RAM 24. The controller 20 is connected between the microprocessor 22 and the dynamic RAM 24.

The microprocessor 22 is, for example, a generalpurpose processor. It has address terminals A1 to A23, data terminals D0 to D15, a read/write control terminal R/$\overline{W}$, an address strobe terminal $\overline{AS}$, an upper-data strobe terminal $\overline{UDS}$, a lower-data strobe terminal $\overline{LDS}$, a data acknowledge terminal $\overline{DTACK}$, and a clock terminal CLK. The address terminals A1 to A9 are connected to the row-address terminals RA0 to RA8 of the DRAM controller 20. The address terminals A10 to A18 are connected to the column-address terminals CA0 to CA8 of the DRAM controller 20. The address terminals A19 to A23, the read/write control terminal R/$\overline{W}$, and address strobe terminal AS are connected to the input terminals of a decoder 26. The output terminals of the decoder 26 are coupled to the chip select terminals CS1 to CS5 of the DRAM controller 20. The decoder 26 decodes the input signals supplied as a mode-designation signal, and supplies an enable signal to one of the chip select terminals CS1 to CS5. The enable signal is supplied to the terminal CS1 in the read-modify-write mode, to the terminal CS2 in the write mode, to the terminal CS3 in the read mode, to the terminal CS4 in the refresh mode, and to the terminal CS5 in the option mode. The data terminals D0 to D15 of the microprocessor 22 are connected to the data terminals D0 to D15 of the DRAM controller 20. The upper-data strobe terminal $\overline{UDS}$ and lower-data strobe terminal $\overline{LDS}$ of the DRAM controller 20 are connected to the input terminals of an AND circuit 28. The output terminal of the AND circuit 28 is connected to the data strobe terminal $\overline{DS}$ of the DRAM controller 20. The acknowledge terminal $\overline{DTACK}$ of the microprocessor 22 is coupled to the ready terminal $\overline{RDY}$ of the DRAM controller 20. A clock signal CLK (25 MHz) is supplied to the clock terminal CLK of the microprocessor 22, and also to the clock terminal CLK of the DRAM controller 20.

The dynamic RAM 24 is a combination of two dynamic RAMs 24A and 24B, each being of 8-bit word configuration. Either dynamic RAM has memory address terminals MA0 to MA8, a row-address strobe terminal $\overline{RAS}$, a columnaddress strobe terminal $\overline{CAS}$, a write enable terminal $\overline{WE}$, and an output enable terminal $\overline{OE}$, which are connected to their equivalents of the DRAM controller 20. The RAMs 24A and 24B have a data terminal each. The data terminals of the dynamic RAM 24A are connected to the memory data terminals MD0 to MD7 of the DRAM controller 20. The data terminals of the dynamic RAM 24B are connected to the memory data terminals MD8 to MD15 of the DRAM controller 20.

Figure 3:
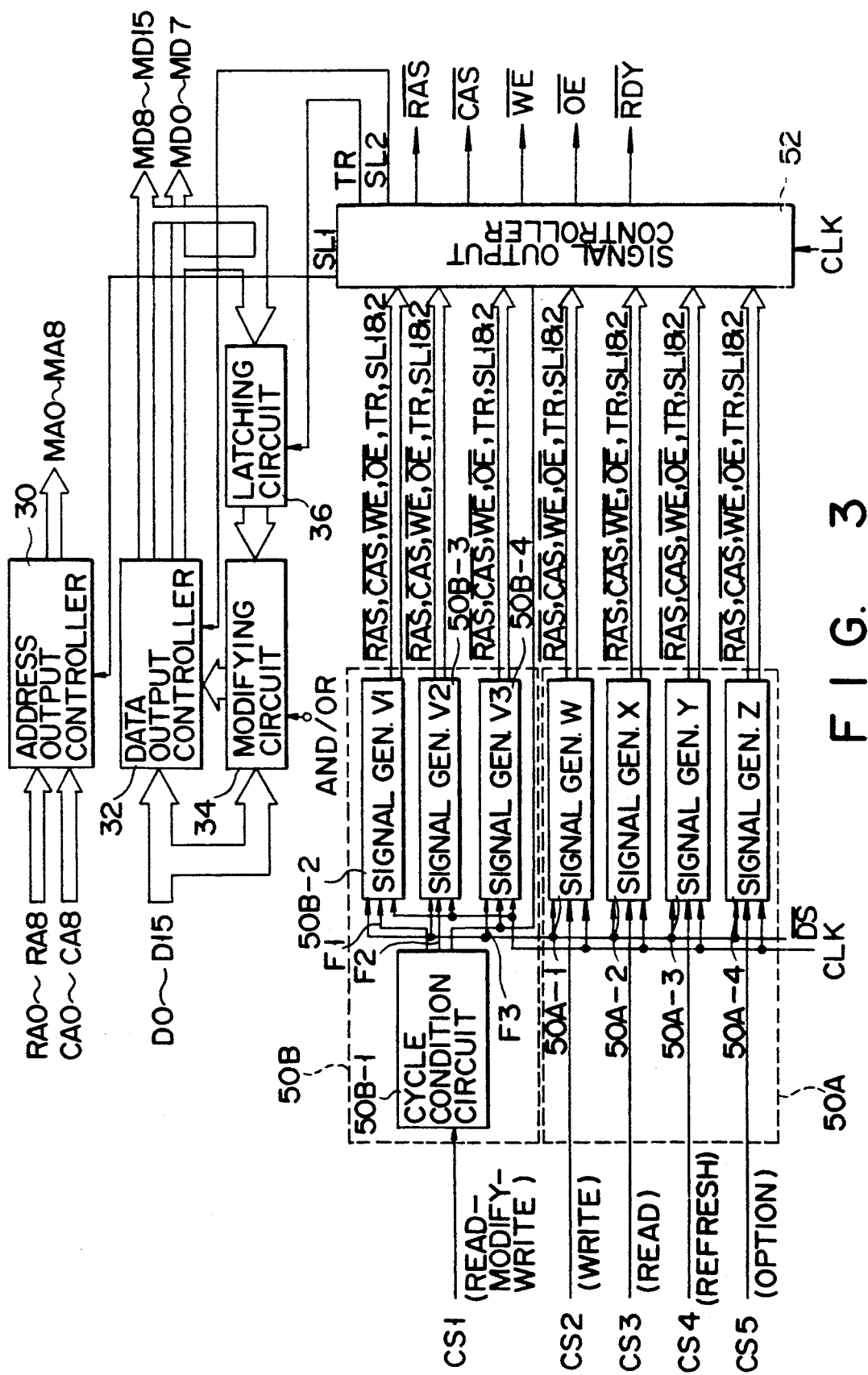
FIG. 3 is a block diagram illustrating the DRAM controller shown in FIG. 2.

FIG. 3 illustrates the DRAM controller 20 in greater detail. As this figure shows clearly, the DRAM controller 20 comprises an address output controller 30, a data output controller 32, a modifying circuit 34, and a latching circuit 36. The address output controller 30 receives the row-address signal RA0–RA8 and column-address signal CA0–CA8 from the microprocessor 22, selects either the row-address signal or the column-address signal in accordance with an address select signal SL1 (later described in detail), and supplies the selected address signal, as a memory address signal MA0–MA8, to the dynamic RAM 24. The latching circuit 36 latches the data MD0–MD15 read-out from the dynamic RAM 24 under the control of a latch trigger signal TR, and supplies this data to the modifying circuit 34. The modifying circuit 34 performs a specific operation (an AND or an OR operation) on the data D0–D15 supplied from the microprocessor 22 and the data MD0–MD15 supplied from the latching circuit 36, and supplies the results of the operation to the data output controller 30. The data output controller 30 selects either the data D0–D15 supplied from the microprocessor 22 or the data supplied from the modifying circuit 34, in accordance with a data select signal SL2 (later described), and supplies the selected data to the dynamic RAM.

The DRAM controller 20 further comprises a first signal-generating unit 50A, a second signal-generating unit 50B, and a signal output controller 52.

The first signal-generating unit 50A generates various control signals in a specific access mode which requires an access time equal to or shorter than the cycle time of the microprocessor 22. The unit 50A has four signal generators 50A-1 to 50A-4 connected to the respective chip select terminals CS2 to CS5, so as to receive an enable signal supplied from the decoder 26. In response to the enable signal, each of the signal generator 50A-1 to 50A-4 generates corresponding control signals, such as a row-address strobe signal $\overline{RAS}$, a column-address strobe signal $\overline{CAS}$, a write enable signal $\overline{WE}$, an output enable signal $\overline{OE}$, a latch trigger signal TR, an address select signal SL1 and a data select signal SL2 at a predetermined sequence. The data strobe signal $\overline{DS}$ and clock signal CLK are referred to in this signal generation.

The second signal-generating unit 50B generates various control signals in a specific access mode which requires an access time longer than the cycle time (i.e., a period of four clock pulses) of the microprocessor 22. The unit 50B has a cycle condition circuit 50B-1 and three signal generators 50B-2 to 50B-4. The cycle condition circuit 50B-1 is connected to the chip select terminal CS1, so as to receive an enable signal supplied from decoder 26. In response to the enable signal, the circuit 50B-1 generates one of flag signals F1, F2, and F3. The signal generators 50B-2, 50B-3, and 50B-4 are connected to receive the flag signals F1, F2, and F3, respectively. In response to the flag signal F1, the signal generator 50B-2 generates a row-address strobe signal $\overline{RAS}$, a column-address strobe signal $\overline{CAS}$, a write enable signal $\overline{WE}$, an output enable signal $\overline{OE}$, a latch trigger signal TR, an address select signal SL1, and a data select signal SL2 at a predetermined sequence. Similarly, the signal generators 50B-3 and 50B-4 generate these signals at the predetermined sequence, in response to the flag signals F2 and F3, respectively.

The signals output by the signal generator 50B-3 are delayed by a predetermined period with respect to those output by the signal generator 50B-2, and the signals output by the signal generator 50B-4 are delayed by a predetermined period with respect to those of the signals output by the signal generator 50B-3. Suppose the dynamic RAM 24 is repeatedly set to the read-modify-write mode. Then, when the dynamic RAM 24 is set to the read-modify-write mode for the first time, the cycle condition circuit 50B-1 outputs the flag signal F1 to the signal generator 50B-2, then the flag signal F2 to the signal generator 50B-3, and finally the flag signal F3 to the signal generator 50B-4. Thereafter, every time the dynamic RAM 24 is set to the read-modify-write mode, the circuit 50B-1 first outputs the flag signal F2 to the signal generator 50B-3 and then the flag signal F3 to the signal generator 50B-4. In other words, the generators 50B-3 and 50B-4 are selected alternately as long as the dynamic RAM 24 is set to the read-modify-write mode repeatedly. When the dynamic RAM 24 is set to any other access mode and set to the read-modify-write mode again, the cycle condition circuit 50B-1 then outputs the flag signal F1, thereby selecting the signal generator 50B-2. Every time the signal generator 50B-4 is selected, the flag signal F3 is supplied to the signal output controller 52.

The signal output controller 52 receives the control signals which any signal generator 50A-1, 50A-2, 50A-3, 50A-4, 50B-2, 50B-3, or 50B-4 generates while the dynamic RAM 24 is set to any access mode. More specifically, it receives the row-address strobe signal $\overline{RAS}$, the column-address strobe signal $\overline{CAS}$, a write enable signal $\overline{WE}$, the output enable signal $\overline{OE}$, the latch trigger signal TR, the address select signal SL1, and the data select signal SL2. The controller 52 supplies the signals $\overline{RAS}$, $\overline{CAS}$, $\overline{WE}$, and $\overline{OE}$ to the dynamic RAM 24, the latch trigger signal TR to the latching circuit 36, the address select signal SL1 to the address output controller 30, and the data select signal SL2 to the data output controller 32.

Further, the signal output controller 52 usually generates a ready signal $\overline{RDY}$ during the machine cycle of the microprocessor 22.

If the generation of the control signals is expressively delayed the dynamic RAM can no longer operate accurately. Therefore, the signal output controller 52 receives the flag signal f3 so as to detect that the sum of the period by which the control signals are delayed reaches a predetermined value. When the flag signal is supplied from the cycle condition circuit 50B-1 to the signal output controller 52, the controller 52 generates the ready signal $\overline{RDY}$ immediately after the machine cycle of the microprocessor 22, setting the microprocessor 22 into a wait state. The microprocessor 22 remains in the wait,state, for the duration of one clock pulse additionally generated in the readmodify-write mode.

FIGS. 4(A) to 4(M) form a timing chart explaining when the DRAM controller 20 generates signals in the case where the dynamic RAM 24 is set to the read-modify-write mode twice continuously. It should be noted that the dynamic RAM 24 is very often set to the read-modify-write mode twice under the control of the microprocessor 22.

When the dynamic RAM 24 is set to this specific access mode in the first memory access cycle, the flag signal F1 output from the cycle condition circuit 50B-1 to the signal generator 50B-2 is enabled. The signal generator 50B-2 therefore outputs DRAM control signals. Of these control signals, the row-address strobe signal $\overline{RAS}$ is disabled at time P1, after the machine cycle of the microprocessor 22.

When the dynamic RAM 24 is set to the read-modify-write mode in the second memory access cycle, the flag signal F2 output from the circuit 50B-1 to the signal generator 50B-3 is enabled. As a result of this, the signal generator 50B-3 outputs DRAM control signals. Of these signals, the row-address strobe signal $\overline{RAS}$ is generated at time P2 in the second memory access cycle. That is, it is delayed with respect to the first row-address strobe signal $\overline{RAS}$ which has been generated at time P3 in the first memory access cycle. The second row-address strobe signal $\overline{RAS}$ is disabled at time P4, after the second machine cycle of the microprocessor 22.

Even if the read-modify-write operation ends with a delay equivalent to one to two clock pulses, the dynamic RAM 24 can be refreshed in the next memory access cycle, i.e., the third memory access cycle.

At the start of the fourth memory access cycle, during which the dynamic RAM 24 is set to be the read-modify-write mode, the flag signal F1 supplied from the cycle condition circuit 50B-1 to the signal generator 50B-2 is enabled. Hence, the signal generator 50B-2 generates a row-address strobe signal $\overline{RAS}$ at time P5, with the same delay as the row-address strobe signal $\overline{RAS}$ generated in the first memory access cycle (i.e., the first read-modify-write operation).

Thereafter, in the fifth memory access cycle et seq., the DRAM controller 20 performs the sequence of the same operations as is described above, without the necessity of setting the microprocessor 22 into a wait state.

In order to access the dynamic RAM 24 for a time shorter than the machine cycle of the microprocessor 22, it suffices to supply the dynamic RAM 24 with the DRAM control signals generated by the first signal-generating unit 50A.

FIGS. 5(A) to 5(M) are a timing chart explaining when the DRAM controller 20 generates signals in the case where the dynamic RAM is set to the read-modify-write mode five times continuously. With reference to these figures, it will be explained how the controller 20 operates in this case.

The DRAM controller 20 operates in exactly the same way as in the case where the dynamic RAM 24 is set to the read-modify-write mode twice continuously, during the first and second memory access cycles. At the start of the third memory access cycle, the flag signal F3 supplied from the cycle condition circuit 50B-1 to the signal generator 50B-4 is enabled. Hence, the signal generator 50B-4 generates a row-address strobe signal $\overline{RAS}$ at time P7, delayed with respect to the signal $\overline{RAS}$ generated by the signal generator 50B-3 in the second machine cycle.

If the row-address strobe signal $\overline{RAS}$ generated from signal generator 50B-4 is disabled, without setting the microprocessor 22 into a wait state as in the first and second memory access cycles, a sufficient refresh time cannot be acquired in the fourth memory access cycle. To provide a sufficient refresh time in the third machine cycle, the microprocessor 22 is set in the wait state for a time equivalent to one clock pulse during the third memory access cycle. As a result of this, the row-address strobe signal $\overline{RAS}$ is disabled at time P8. Therefore, the delay in the row-address strobe signal $\overline{RAS}$ is reduced. The dynamic RAM 24 does not fail to operate even if the dynamic RAM is set to the read-modify-write mode in the fourth memory acces cycle. In this cycle, the flag signal F2 supplied from the cycle condition circuit 50B-1 to the signal generator 50B-3 is enabled, whereby the signal generator 50B-3 outputs a row-address strobe signal $\overline{RAS}$, in the same way as in the second memory access cycle.

In summary, even if the dynamic RAM 24 is set to the read-modify-write mode five times continuously, DRAM control signals are appropriately generated from one of the signal generators 50B-2 to 50B-4 in the first to fifth memory access cycles. Therefore, the microprocessor 22 is not set to a wait state in the first, second, and fourth memory access cycles, though it is set to the wait state in the third and fifth memory access cycles.

As has been described, to set the dynamic RAM 24 to the read-modify-write mode twice continuously, it is unnecessary to set the microprocessor 22 into a wait state. Further, even if the dynamic RAM 24 is to be set to the read-modify-write mode five times continuously, it suffices to set the microprocessor 22 at a wait state when the dynamic RAM 24 is set to this specific access mode for the third time and the fifth time. Hence, the cycle of the read-modify-write mode is shortened as compared to the case where the microprocessor 22 is set to a wait state every time the dynamic RAM 24 is set to the read-modify-write mode. Therefore, the DRAM controller 20 shortens the access time of the dynamic RAM 24, more particularly the cycle time thereof.

Additional advantages and modifications will readily occur to those skilled in the art. Therefore, the invention in its broader aspects is not limited to the specific details, representative device, and illustrated example shown and described herein. Accordingly, various modifications may be made without departing from the spirit or scope of the general inventive concept as defined by the appended claims and their equivalents.

What is claimed is:

1. A DRAM controller comprising:
   address output means for transferring an address-designating signal to a dynamic RAM;
   data output means for transferring data to be written into and read-out from a memory region of the dynamic RAM which is designated by the address-designating signal; and
   control means responsive to a mode-designating signal for generating various control signals corresponding to an access mode of the dynamic RAM designated by the mode-designating signal, and for supplying control signals to said dynamic RAM, to said address output means, and to said data output means in a predetermined sequence;
   said control means including signal-generating means for generating control signals in a specific access mode which requires an access time longer than a machine cycle of a processor for generating the address-designating signal, the data to be written, and the mode-designating signal, said signal-generating means delaying generation of control signals every time designation of the specific access mode by the mode-designating signal is repeated.

2. A controller according to claim 1, wherein said control means includes wait control means for setting the processor in a waiting state when a total period by which controls signals are delayed reaches a predetermined value.

3. A controller according to claim 2, wherein said signal generating means includes a plurality of signal generators for generating control signals and selecting means for selecting one of said signal generators responsive to designation of the specific access mode by the mode-designating signal.

4. A controller according to claim 3, wherein said plurality of signal generators includes a first signal generator for generating control signals, a second signal generator for generating control signals with a first predetermined delay, and a third signal generator for generating control signals with a second predetermined delay larger than said first predetermined delay.

5. A controller according to claim 4, wherein said selecting means includes sequential selection means for sequentially selecting said first to third signal generators.

6. A controller according to claim 5, wherein said wait control means includes setting means for setting said processor into a waiting state when it is detector that said third signal generator has been selected.

7. A controller according to claim 6, further comprising decoder means for decoding signals supplied as said mode-designation signal from an address strobe terminal, a read/write terminal, a read/write control terminal, and a part of address terminals of said processor.

8. A controller according to claim 1, wherein said specific access mode is a read-modify-write mode.

9. A controller according to claim 1, wherein said control means further includes second signal-generating means for generating control signal in another access mode which requires an access time equal to or shorter than the machine cycle of said processor.

* * * * *